(12) United States Patent
Flaig et al.

(10) Patent No.: US 11,025,035 B2
(45) Date of Patent: Jun. 1, 2021

(54) GENERATING LASER PULSES

(71) Applicant: TRUMPF LASER GMBH, Schramberg (DE)

(72) Inventors: Rainer Flaig, Eschbronn (DE); Oliver Rapp, Eschbronn (DE); Daniel Glunk, Fluorn-Winzeln (DE)

(73) Assignee: TRUMPF LASER GMBH, Schramberg (DE)

( * ) Notice: Subject to any disclaimer, the term of this patent is extended or adjusted under 35 U.S.C. 154(b) by 0 days.

(21) Appl. No.: 16/245,572

(22) Filed: Jan. 11, 2019

(65) Prior Publication Data
US 2019/0148910 A1 May 16, 2019

Related U.S. Application Data

(63) Continuation of application No. PCT/EP2017/067620, filed on Jul. 12, 2017.

(30) Foreign Application Priority Data

Jul. 14, 2016 (DE) .......................... 102016212929.5

(51) Int. Cl.
*H01S 5/042* (2006.01)
*H01S 5/06* (2006.01)
*H01S 5/062* (2006.01)

(52) U.S. Cl.
CPC .......... *H01S 5/0428* (2013.01); *H01S 5/0617* (2013.01); *H01S 5/06216* (2013.01)

(58) Field of Classification Search
CPC ... H01S 5/0428; H01S 5/06216; H01S 5/0617
See application file for complete search history.

(56) References Cited

U.S. PATENT DOCUMENTS 6,256,329 B1 * 7/2001 Ishizuka ............. H01S 5/06216
372/30
7,428,253 B2 9/2008 Murison et al.
(Continued)

FOREIGN PATENT DOCUMENTS

| CA | 2729088 | 7/2012 |
|---|---|---|
| CN | 103022895 A | 4/2013 |
| CN | 104094484 A | 10/2014 |

OTHER PUBLICATIONS

International Search Report and Written Opinion in International Application No. PCT/EP2017/067620, dated Jan. 9, 2018, 13 pages (with English translation).
(Continued)

*Primary Examiner* — Yuanda Zhang
(74) *Attorney, Agent, or Firm* — Fish & Richardson P.C.

(57) ABSTRACT

A laser pulse generator includes a pulse shape generation device and a clock unit. The generation device includes a pulse shape repository, a digital-to-analog converter (DAC), a first terminal for connecting a start signal line, a second terminal for connecting a clock signal line, and a third terminal for connecting a pulse line. The first and second terminals are connected to the pulse shape repository and the DAC such that when a predefined start signal is present, data is transferred from the pulse shape repository to the DAC and converted by the DAC into an output pulse, for example, at a rate of a clock signal. The output pulse is supplied at the third terminal for actuating a driver of a laser diode. The clock unit is connected to the second terminal via the clock signal line and includes a reset terminal connected to the start signal line.

21 Claims, 3 Drawing Sheets

(56) References Cited

U.S. PATENT DOCUMENTS

| | | |
|---|---|---|
| 7,817,686 B2 | 10/2010 | Peng et al. |
| 8,411,716 B2 | 4/2013 | Jacob et al. |
| 9,083,148 B2 | 7/2015 | Berendt et al. |
| 2009/0323741 A1 | 12/2009 | Deladurantaye et al. |
| 2012/0187860 A1 | 7/2012 | Jacob et al. |
| 2014/0218791 A1 | 8/2014 | Desbiens et al. |
| 2016/0197451 A1 | 7/2016 | Kraemer et al. |

OTHER PUBLICATIONS

CN Office Action in Chinese Appln. No. 201780043608, dated Jul. 1, 2020, 19 pages (with English translation).
CN Search Report in Chinese Appln. No. 201780043608, dated Jun. 24, 2020, 2 pages.

\* cited by examiner

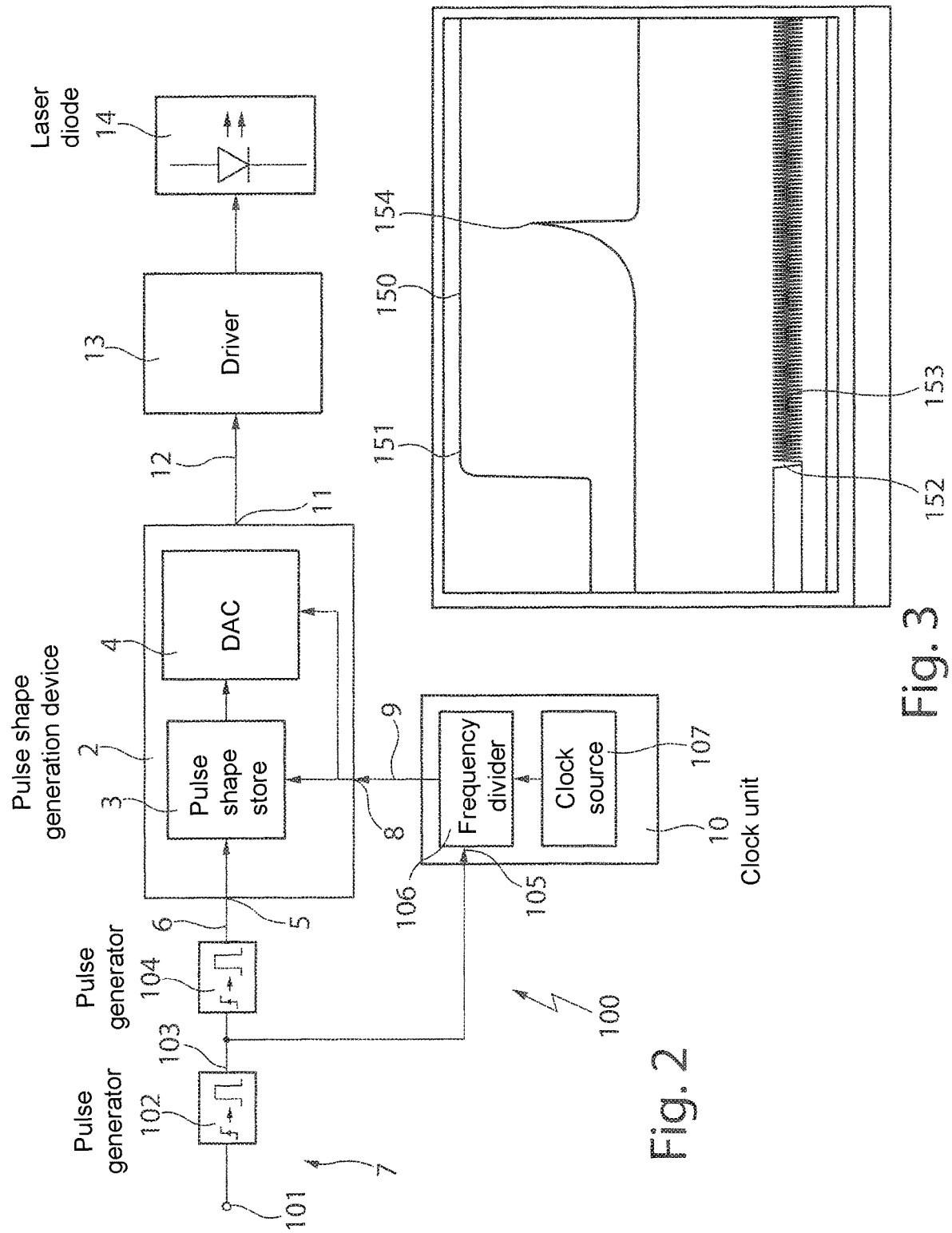

GENERATING LASER PULSES

CROSS REFERENCE TO RELATED APPLICATIONS

This application is a continuation of and claims priority under 35 U.S.C. § 120 from PCT Application No. PCT/EP2017/067620 filed on Jul. 12, 2017, which claims priority from German Application No. DE 10 2016 212 929.5, filed on Jul. 14, 2016. The entire contents of each of these priority applications are incorporated herein by reference.

TECHNICAL FIELD

The present disclosure relates to laser pulse generators and methods for generating laser pluses using laser pulse generators.

BACKGROUND

A laser diode produces a laser pulse by a driver of the laser diode being controlled with a laser pulse shape. Laser pulse shapes can be output in a simple manner via a digital/analogue converter (DAC). With an output clock a storage content of a pulse shape repository is output via the digital/analogue converter (DAC). In the event of a so-called "pulse on demand" triggering started by a user, an output jitter may occur since the start (trigger) event does not necessarily correlate to the output clock of the pulse shape repository or DAC.

SUMMARY

One aspect of the present disclosure is to develop a laser pulse generator in such a manner and to provide a method for producing a laser pulse by means of which the output jitter can be reduced.

Another aspect of the present disclosure features a laser pulse generator having
  a) a pulse shape generation device, having
    i. a pulse shape repository for storing data, in particular a digitally encoded pulse shape, and a digital/analogue converter (DAC) which is connected thereto,
    ii. a first connection for connecting a start signal line of a start signal path,
    iii. a second connection for connecting a clock signal line,
    iv. a third connection for connecting a pulse line, where the first and second connections are connected to the pulse shape repository and the DAC in such a manner that, with a predetermined start signal, data are directed from the pulse shape repository to the DAC and are converted by the DAC, in particular at the rate of a clock signal, into an output pulse which is provided at the third connection for controlling a driver for a laser diode,
  b. a clock unit which is connected to the second connection via the clock signal line, where,
  c. the clock unit has a reset connection which is connected to the start signal path.

In this case, the pulse shape repository is configured to store a digitized signal, in particular a digital word. The store content stored in the pulse shape repository defines in this instance a specific pulse shape for the output pulse of the DAC. The output pulse of the DAC may then be supplied to the driver. The driver may generate the laser pulse for the laser diode from the signal which is supplied to it. It is therefore set out below that a digitally encoded pulse shape is stored in the pulse shape repository. In this instance, there may be provision for there to be stored in the pulse shape repository only a digitally encoded pulse shape which is written once to the pulse shape repository. There may also be provision for the pulse shape repository to be writable and consequently for different digitally encoded pulse shapes to be able to be stored. Furthermore, it is conceivable for different digitally encoded pulse shapes to be stored in the pulse shape repository and for it to be possible to select which digitally encoded pulse shape is intended to be output to the digital/analogue converter. In particular data can be stored digitally in the pulse shape repository.

By the laser pulse generator according to the present disclosure, there is produced a synchronization of the clock unit with the start signal or a signal which is related thereto. In this manner, the output jitter of the output signal at the output of the pulse shape generation device can be reduced.

According to an embodiment, there may be provision for the clock unit to be constructed as a start/stop oscillator. A start/stop oscillator is an oscillator which can be stopped by a signal and can subsequently be released again. This means that the start time of the output of a clock signal can be adjusted, determined or influenced by the oscillator. In particular, the start/stop oscillator may be briefly stopped by the start signal or a related signal so that during this stoppage time the data in the pulse shape repository can be released by the start signal and subsequently the oscillator can be started or released so that the data from the pulse shape repository can be output at the rate of the clock unit and/or the data output from the pulse shape repository are converted at the rate of the clock signal in the DAC into an output pulse.

According to an alternative embodiment, there may be provision for the clock unit to have a resettable frequency divider and a clock source. The clock source may have a clock frequency or output a signal at a clock frequency which is greater than the clock frequency at the output of the clock unit. The clock frequency of the clock source may have an integral multiple of, in particular at least double, more preferably at least four times, the clock frequency at the output of the clock unit. In particular, the clock frequency of the clock source may be greater than is permissible for the operation of the DAC and/or the pulse shape repository. The frequency may be brought/lowered by the frequency divider into a range so that, for example, the DAC or the pulse shape repository can be operated therewith. The frequency of the signal output from the clock source can be divided in a predetermined ratio by the frequency divider. In this instance, the frequency divider is preferably connected to the second connection via the clock signal line. The signal output by the frequency divider can consequently influence or determine the output of the data from the pulse shape repository and/or the conversion of the data output by the pulse shape repository in the DAC into an output pulse. In particular, the data from the pulse shape repository can be output at the rate of the signal output by the frequency divider and/or the data output by the pulse shape repository can be converted at the rate of the clock signal in the DAC into an output pulse. That is to say, the resettable frequency divider generates the output clock or the clock signal for the pulse shape output and/or the output pulse production.

The frequency divider can be placed for some time in a basic state, that is to say, a state in which no signal is output by the frequency divider by the start signal or a related signal. Whilst the frequency divider is in the basic state, the start signal can be transmitted to the pulse shape repository so that the data stored at that location are released. As soon as the frequency divider is released again, the output of the data starts synchronously and consequently the digitally encoded pulse shapes from the pulse shape repository and/or the production of the output pulse. The output jitter is consequently lower by the factor of the frequency divider than that of the actual output clock, that is to say, of the frequency of the output signal of the resettable frequency divider. For example, the clock source may produce a 600 MHz signal. As a result of the frequency divider, this signal can be divided by four so that the output clock (clock signal) is at a frequency of 150 MHz which corresponds to a period duration of 6.6 ns. The output jitter is then only 1.7 ns in this example.

There may be arranged in the start signal path a first pulse generator whose output is connected to the reset connection of the clock unit. There may in this instance be supplied to the first pulse generator a trigger signal from which the start signal is generated in the start signal path. As a result of the first pulse generator, it is possible to produce a signal whose pulse duration is sufficiently long to reliably reset or start the clock unit. Consequently, it can be ensured that a synchronization is carried out at the (a) higher rate and the output jitter is reduced.

Furthermore, there may be provided in the start signal path a second pulse generator whose output is connected to the first connection of the pulse shape generation device. The second pulse generator preferably receives as an input signal the output signal of the first pulse generator. As a result of the second pulse generator, the actual start signal which is supplied to the pulse shape repository can be generated.

In this instance, it is advantageous for the second pulse generator to produce a pulse with a larger pulse duration than the first pulse generator. The pulse duration of the second pulse generator can be long enough for the conversion of the data of the pulse shape repository by the DAC into an output pulse to be able to be fully completed.

The pulse shape generation device may be constructed in a monolithic manner. This means that the pulse shape repository for storing data and the DAC which is connected thereto can be produced in one module.

Furthermore, the clock unit may also at least partially be integrated in this module. In particular, a quartz oscillator may be produced outside the module and the frequency divider may be integrated in the module.

The start/stop oscillator may be completely integrated in the module.

The first pulse generator may also be integrated in the module.

The second pulse generator may also be integrated in the module.

The module may be a programmable logic device (PLD), in particular a field-programmable gate array (FPGA).

Another aspect of the present disclosure features a method for producing a laser pulse having the steps of:
 a. outputting data, in particular a digitally encoded pulse shape, from a pulse shape repository to a DAC in response to a start signal,
 b. producing an output pulse in the DAC, in particular at the rate of a clock unit, and outputting the output pulse, where
 c. the clock unit is synchronized to the start signal or to a signal which is related to the start signal.

The synchronization of the clock unit with respect to the start signal or to a signal related to the start signal can be carried out by the clock unit being able to be reset by the start signal or a related signal or being able to be temporarily moved into a basic state in which no clock signal is output. In particular, it can be determined as a result of the start signal or a related signal when the clock unit begins to output a clock signal which is supplied to the pulse shape repository and/or the DAC.

In a particularly simple manner, the clock signal of the clock unit can be produced by means of a frequency divider. In particular in this instance, the frequency divider can be reset or stopped by the start signal or a signal related to the start signal and the clock signal output can be restarted.

According to an alternative method variant, there may be provision for the clock signal of the clock unit to be produced by a start/stop oscillator. In this instance, the start/stop oscillator can be stopped by the start signal or the signal which is related to the start signal and released/started again. The synchronization is thereby carried out with the start signal or the signal related thereto.

The start signal can be produced by a pulse generator, where the pulse generator may be arranged in a start signal path on which a trigger signal is converted into the start signal. A signal of the start signal path can be used to control, in particular to reset, the clock unit and consequently to synchronize the clock unit with the start signal.

Using a pulse generator can produce a start signal which has a sufficient length to ensure that the conversion of the data by the DAC into an output pulse can be fully completed. The signal supplied to the pulse generator may be considered to be a signal which is related to the start signal and supplied to the clock unit. The signal related to the start signal can be produced by a first pulse generator. In this instance, the output signal of the first pulse generator can be supplied to the additional pulse generator which generates the start signal therefrom. As a result of the first pulse generator which is preferably located in the start signal path, the signal which is related to the start signal can consequently be generated.

The pulse generators may in this instance be constructed, for example, as monostable flip-flops. This means that they are moved into a "high" state for a specific time and then assume a "low" state again. For example, the first pulse generator can generate from a trigger signal a pulse with a length of 10 ns. From this signal, it is possible in turn to produce using a second pulse generator a pulse with a length of approximately 100 ns. A signal or a pulse with such a length may be sufficient to ensure that the data output by a pulse shape repository are completely converted by the DAC into an analogue output signal or an output pulse.

Other features and advantages will be appreciated from the following description of embodiments, with reference to the Figures of the drawings, and from the claims. The individual features can be implemented individually per se or together in any combination in a variant of the present disclosure.

Embodiments of the present disclosure are schematically illustrated in the drawings and are explained in greater detail below with reference to the Figures of the drawings.

BRIEF DESCRIPTION OF THE DRAWINGS

FIG. 2 shows a first embodiment of a laser pulse generator.
FIG. 3 shows a graph for explaining the signals occurring in the laser generator of FIG. 2.

DETAILED DESCRIPTION

Figure 1:
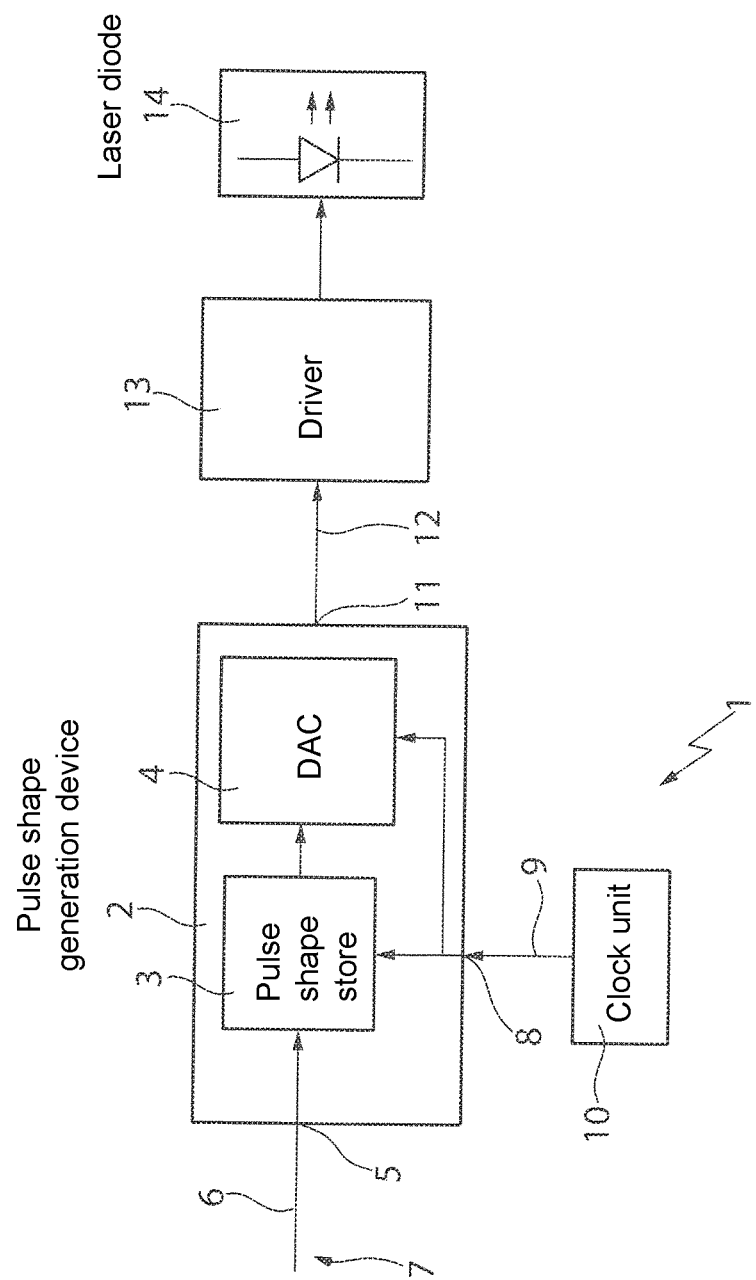
FIG. 1 shows a laser pulse generator.

In FIG. 1, a laser pulse generator 1 is illustrated. The laser pulse generator 1 includes in this instance a pulse shape generation device 2 which has a pulse shape repository 3 for storing a pulse shape. In the pulse shape repository 3, the pulse shape is stored as a digitally encoded pulse shape. The pulse shape repository 3 is connected to a digital/analogue converter 4. A digitally encoded pulse shape can be converted by the digital/analogue converter 4 into an analogue pulse shape or an output pulse. The pulse shape generation device 2 has a first connection 5 for connecting a start signal line 6 of a start signal path 7. A start signal can be transmitted via the start signal path 7. A second connection 8 is provided for connection of a clock signal line 9. A clock unit 10 is connected to the clock signal line 9. This supplies the pulse shape repository 3 and the digital/analogue converter 4 with a clock signal. A driver 13 for a laser diode 14 is connected via a pulse line 12 to the output connection 11 of the pulse shape generation device 2. When a corresponding start signal reaches the pulse shape repository 3, the digitally encoded pulse shape is output at the rate of the clock unit 10 at the output thereof and then converted into an analogue output signal in the digital/analogue converter 4. If there is a time offset between the appearance of the start signal and the clock signal of the clock unit 10, an output jitter of the output signal output at the output 11 may occur.

In the embodiment of a laser pulse generator 100 according to the disclosure according to FIG. 2, the same reference numerals are used as in FIG. 1 as long as corresponding elements are indicated thereby. To produce an output pulse of the digital/analogue converter (DAC) 4 at the output connection 11, a trigger signal is first supplied to the start signal path 7 at the location 101. From this trigger signal, a pulse signal is generated by a pulse generator 102 and is output at the output 103. From this pulse signal, a start signal is generated by a pulse generator 104 and is guided to the pulse shape generation device 2 via the start signal line 6 of the start signal path 7 and the first connection 5. The pulse signal output at the output 103 is consequently considered as a signal related to the start signal. The pulse signal is also supplied to a reset connection 105 of the clock unit (or clocking device) 10 and there in particular forwarded to a frequency divider (or frequency splitter) 106. The signal output at the output 103 is consequently a reset signal. It serves to move the frequency divider 106 into a basic state. This means that for the duration of the pulse which is generated by the pulse generator 102, the frequency divider 106 is moved into its basic state. As soon as the falling flank (or side) of the pulse produced by the pulse generator 102 has reached the frequency divider 106, the frequency divider 106 may output a clock signal. The clock signal has in this instance a fraction of the frequency of a clock signal which is generated by the clock source 107. For example, the clock source 107 may produce a 600 MHz signal which is divided by the frequency divider 106 by the factor 4 so that a signal at a frequency of 150 MHz is supplied as a clock signal to the pulse shape generation device 2 at the second output 8.

The pulse shape repository 3 is released by the start signal supplied at the connection 5. This means that data stored in the pulse shape repository 3 are ready for output. These data are output at the rate of the clock output by the clock unit 10 and are forwarded to the digital/analogue converter 4, where an output pulse is generated from the digital data of the pulse shape repository 3 and is output at the connection 11. The output pulse is supplied to a driver 13 which controls a laser diode 14. In the embodiment shown, the digital/analogue converter 4 is also connected to the clock unit 10 so that the digital/analogue converter 4 is supplied with the same clock signal as the pulse shape repository 3.

The pulse generator 104 produces a pulse with a larger length/pulse width than the pulse produced by the pulse generator 102. The length of the pulse which is produced by the pulse generator 104 can be selected in such a manner that it is ensured that the data stored in the pulse shape repository 3 are completely converted into the output pulse.

For example, the pulse generator 104 may produce an output signal, in particular a pulse, which has a length of approximately 100 ns. The pulse generator 102 may produce an output signal at the output 103, in particular produce a pulse which has a length which is approximately a tenth of the length of the output signal, in particular pulse, of the pulse generator 104. In the present embodiment, the duration of the output pulse at the output 103 may be approximately 10 ns.

FIG. 3 illustrates with the reference numeral 150 the signal which is produced by the pulse generator 102 and which is output at the output 103. As the flank 151 of this signal increases, the frequency divider 106 is briefly suspended or stopped which can be seen with reference to the gap 152. Subsequently, a synchronous signal which has a quarter of the frequency of the signal of the clock source 107 is output. This is indicated by the reference numeral 153. The reference numeral 154 refers to the output pulse which is output at the output 11, as a result of the conversion of the data stored in the pulse shape repository 3 into an analogue signal by the digital/analogue converter 4. It can be seen that this signal has a decreased jitter.

Figure 4:
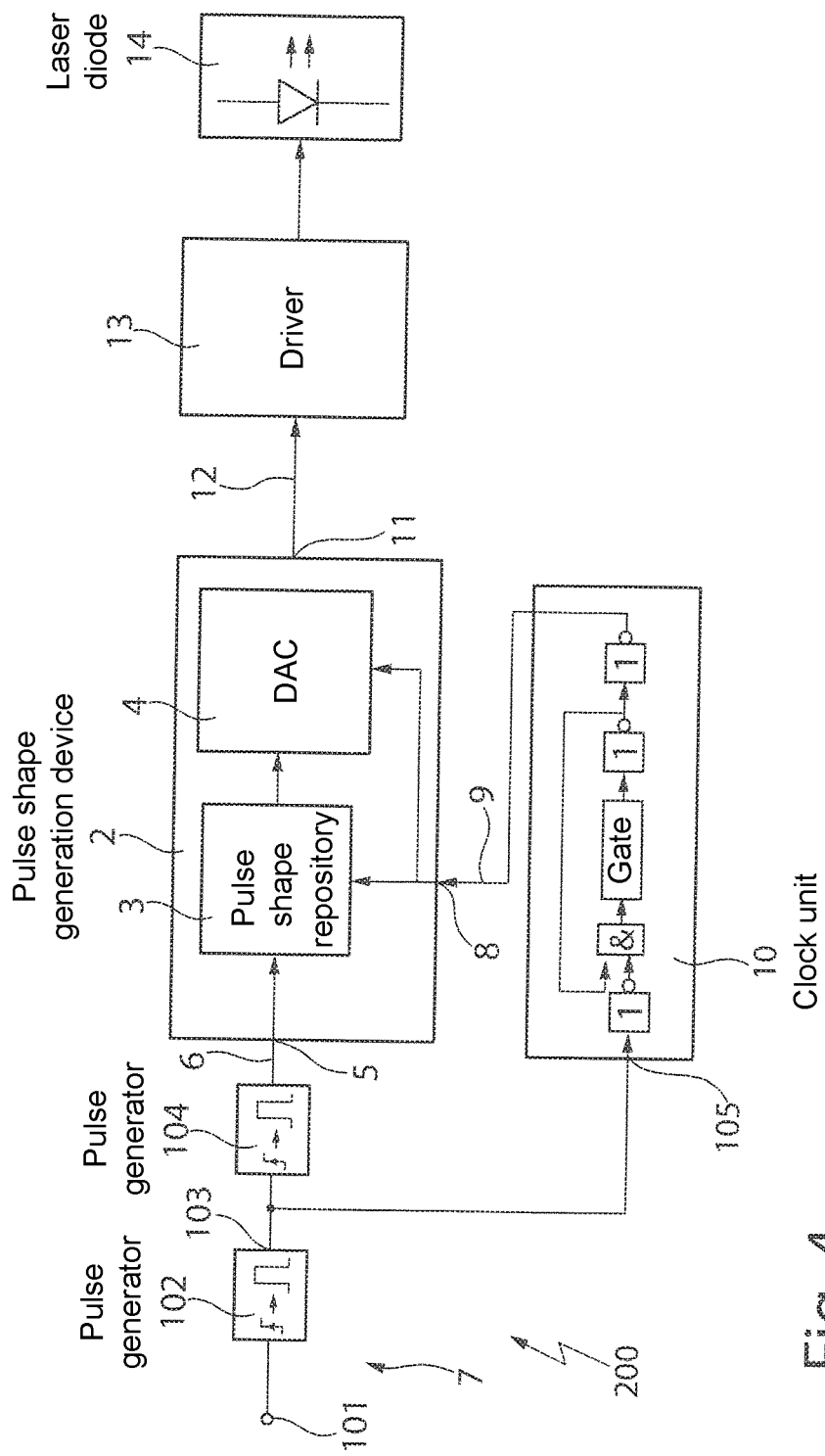
FIG. 4 shows an alternative embodiment of a laser pulse generator.

FIG. 4 substantially corresponds to FIG. 2. As long as the same elements are present, the same reference numerals are used. The basic difference of the laser pulse generator 200 of FIG. 4 in relation to the laser pulse generator 100 of FIG. 2 is that the clock unit 10 is constructed as a start/stop oscillator. In some implementations, in the clock unit 10, a first inverter, an AND gate, a particular gate (e.g., for time delay), a second inverter, and a third inverter are sequentially arranged and connected with each other. An input of the first inverter is coupled to the connection 105. An output of the first inverter and an output of the second inverter are coupled to two inputs of the AND gate. An output of the third inverter is an output of the clock unit 10. The start/stop oscillator can be started and stopped by the signal supplied via the connection 105. In particular, the start/stop oscillator can be synchronized with a signal which is related to the start signal, that is to say, the signal which is output at the output 103 of the pulse generator 102. The start/stop oscillator can be briefly stopped by the signal which is related to the start signal. As long as the start/stop oscillator is stopped, the pulse shape release can be issued by the start signal. Subsequently, the start/stop oscillator can be released and, at the rate of the clock signal which is produced by the start/stop oscillator, the digitized pulse shape from the pulse shape repository 3 can be output and the output signal can be produced by the digital/analogue converter 4. The analogue start/stop oscillator which forms the clock unit 10 is indicated only very schematically. Many different solutions for producing a start/stop oscillator, in particular an analogue start/stop oscillator, are conceivable. If the clock unit 10 is constructed as a start/stop oscillator, the jitter can be even further reduced.

In all the embodiments, the pulse shape generation device 2 may be constructed in a monolithic manner. This means that the pulse shape repository 3 for storing data and the digital/analogue converter (DAC) 4 which is connected thereto can be produced in one module.

Furthermore, the clock unit 10 may at least partially also be integrated in this module. The clock source 107, for example, a quartz oscillator, may thus be produced outside the module, but the frequency divider 106 may be integrated in the module.

The start/stop oscillator may be completely integrated in the module. The first pulse generator 102 may also be integrated in the module.

The second pulse generator 104 may also be integrated in the module. The module may be a programmable logic device (PLD), in particular an FPGA.

It is explicitly stated that all features disclosed in the description and/or the claims are intended to be disclosed separately and independently from each other for the purpose of original disclosure as well as for the purpose of restricting the claimed invention independent of the composition of the features in the embodiments and/or the claims. It is explicitly stated that all value ranges or indications of groups of entities disclose every possible intermediate value or intermediate entity for the purpose of original disclosure as well as for the purpose of restricting the claimed invention, in particular as limits of value ranges.

What is claimed is:

1. A laser pulse generator comprising:
    a pulse shape generation device having:
        a pulse shape repository storing data,
        a digital/analogue converter (DAC) connected to the pulse shape repository,
        a first connection for connecting a start signal line of a start signal path,
        a second connection for connecting a clock signal line, and
        a third connection for connecting a pulse line,
        wherein the first and second connections are connected to the pulse shape repository and the DAC, wherein the pulse shape repository is arranged to direct pulse shape data to the DAC upon receiving a predetermined start signal, and wherein the DAC is configured to convert the pulse shape data into an output pulse and to provide the output pulse to the third connection to control a driver of a laser diode; and
    a clock unit connected to the second connection by the clock signal line and configured to output a clock signal to the pulse shape generation device, wherein the clock unit comprises a reset connection connected to the start signal path.

2. The laser pulse generator of claim 1, wherein the DAC is configured to convert the pulse shape data into the output pulse at a rate of the clock signal received at the second connection.

3. The laser pulse generator of claim 1, wherein the clock unit comprises a start/stop oscillator configured to be first stopped by the start signal or a signal related to the start signal and then be released to output the clock signal, such that the data stored in the pulse shape repository is released by the start signal within the stopping of the oscillator and then is converted at the rate of the clock signal in the DAC into the output pulse.

4. The laser pulse generator of claim 1, wherein the clock unit comprises a resettable frequency divider and a clock source.

5. The laser pulse generator of claim 4, wherein the resettable frequency divider is configured to receive the start signal or a signal related to the start signal through the reset connection and then be reset by the start signal or the signal related to the start signal.

6. The laser pulse generator of claim 5, wherein the frequency divider is configured to be placed in a basic state for a period of time and released from the basic state to output the clock signal after the period of time, such that, while the frequency divider is in the basic state, the start signal is transmitted to the pulse shape repository to release the stored data and, once the frequency divider is released, the data is output synchronously at the rate of the clock signal, and
    wherein no clock signal is output by the frequency divider in the basic state.

7. The laser pulse generator of claim 5, wherein the resettable frequency divider is arranged to receive an initial clock signal generated by the clock source and generate the clock signal having a frequency that is a fraction of a frequency of the initial clock signal.

8. The laser pulse generator of claim 1, further comprising a first pulse generator arranged in the start signal path, wherein the first pulse generator comprises a first output connected to the reset connection of the clock unit.

9. The laser pulse generator of claim 8, further comprising a second pulse generator that includes an input connected to the first output of the first pulse generator and a second output connected to the first connection of the pulse shape generation device.

10. The laser pulse generator of claim 9, wherein the first pulse generator is arranged to receive a trigger signal via the start signal line and generate a pulse signal based on the trigger signal, and
    wherein the second pulse generator is arranged to receive the pulse signal and configured to generate the start signal based on the pulse signal.

11. The laser pulse generator of claim 10, wherein the start signal generated by the second pulse generator has a pulse length larger than that of the pulse signal generated by the first pulse generator.

12. The laser pulse generator of claim 10, wherein the second pulse generator is configured to generate the start signal with a pulse length large enough to ensure that the data stored in the pulse shape repository are completely converted into the output pulse.

13. The laser pulse generator of claim 1, wherein the reset connection is constructed in the clock unit and configured such that a synchronization of the clock unit with the start signal or a signal related to the start signal is carried out to reduce an output jitter of the output pulse.

14. A method of generating laser pulses, the method comprising:
    outputting data from a pulse shape repository to a digital/analogue converter (DAC) in response to a start signal;
    generating an output pulse in the DAC based on a clock signal from a clock unit; and
    outputting the output pulse,
    wherein the clock unit is synchronized to one of the start signal and a signal related to the start signal, and wherein the clock signal is generated by a resettable frequency divider of the clock unit.

15. The method of claim 14, wherein the data comprises a digitally encoded pulse shape.

16. The method of claim 14, further comprising generating the start signal by a pulse generator.

17. The method of claim 14, further comprising:
    generating, by a first pulse generator, the signal related to the start signal, the clock unit being synchronized to the signal related to the start signal; and
    generating, by a second pulse generator, the start signal based on the signal related to the start signal.

18. The method of claim 14, wherein outputting the output pulse comprises:

outputting the output pulse to a driver for a laser diode, wherein the output pulse controls the driver for the laser diode.

19. A method of generating laser pulses, the method comprising:
  outputting data from a pulse shape repository to a digital/analogue converter (DAC) in response to a start signal;
  generating, by a first pulse generator, a signal related to the start signal, a clock unit being synchronized to the signal related to the start signal;
  generating, by a second pulse generator, the start signal based on the signal related to the start signal;
  generating an output pulse in the DAC based on a clock signal from the clock unit, wherein the clock unit is synchronized to one of the start signal and the signal related to the start signal; and
  outputting the output pulse.

20. The method of claim 19, wherein the data comprises a digitally encoded pulse shape.

21. The method of claim 19, wherein outputting the output pulse comprises:
  outputting the output pulse to a driver for a laser diode, wherein the output pulse controls the driver for the laser diode.

* * * * *